United States Patent
Gelbart

(12) 
(10) Patent No.: US 6,861,203 B2
(45) Date of Patent: Mar. 1, 2005

(54) NON-PERMANENT INKJETTED FLEXOGRAPHIC MASK

(75) Inventor: Daniel Gelbart, Vancouver (CA)

(73) Assignee: CREO Inc., Burnaby (CA)

( * ) Notice: Subject to any disclaimer, the term of this patent is extended or adjusted under 35 U.S.C. 154(b) by 0 days.

(21) Appl. No.: 10/316,921

(22) Filed: Dec. 12, 2002

(65) Prior Publication Data

US 2003/0112312 A1 Jun. 19, 2003

Related U.S. Application Data

(60) Provisional application No. 60/339,341, filed on Dec. 13, 2001.

(51) Int. Cl.[7] .............................. G03F 7/38; G03F 7/11; B41C 1/00
(52) U.S. Cl. ....................... 430/306; 430/300; 430/935; 430/309
(58) Field of Search .................................. 430/300–309

(56) References Cited

U.S. PATENT DOCUMENTS

| | | | |
|---|---|---|---|
| 2,760,863 A | * 8/1956 | Plambeck, Jr. | 430/306 |
| 3,867,150 A | * 2/1975 | Ketley | 430/138 |
| 5,245,365 A | * 9/1993 | Woodard et al. | 347/86 |
| 5,262,275 A | 11/1993 | Fan | 430/306 |
| 6,180,325 B1 | 1/2001 | Gelbart | 430/300 |
| 6,312,872 B1 | * 11/2001 | Murphy et al. | 430/306 |
| 2002/0025492 A1 | * 2/2002 | Murphy et al. | 430/271.1 |

FOREIGN PATENT DOCUMENTS

| | | | | |
|---|---|---|---|---|
| JP | 08044044 A | * | 2/1996 | G03F/7/00 |
| WO | WO 9801792 A1 | * | 1/1998 | G03F/7/26 |
| WO | WO 0127697 A1 | * | 4/2001 | |

OTHER PUBLICATIONS

Jiyon, Patent Abstracts of Japan Publication No. 08–044044, date of publication Feb. 16, 1996 with abstract and machine English translation of 1 page claims and seven pages detailed description.*

* cited by examiner

*Primary Examiner*—Cynthia Hamilton
(74) *Attorney, Agent, or Firm*—Oyen Wiggs Green & Mutala

(57) ABSTRACT

A method for making a printing plate is disclosed comprising mounting a printing plate to a holder; applying a non-permanent patterned coating to an outer surface of the printing plate by moving a coating applicator relative to the holder; and, exposing the printing plate to actinic radiation through the patterned coating without removing the printing plate from the holder. The invention avoids handling-induced damage by performing coating and exposure steps in a single apparatus.

17 Claims, 2 Drawing Sheets

US 6,861,203 B2

NON-PERMANENT INKJETTED FLEXOGRAPHIC MASK

CROSS REFERENCE TO RELATED APPLICATION

This application claims the benefit of the filing date of U.S. application No. 60/339341 filed on 13 Dec. 2001 pursuant to the provisions of 35 USC §119(e).

TECHNICAL FIELD

The invention pertains to the field of printing and, in particular, to the field of masks for flexographic printing.

BACKGROUND

Photosensitive flexographic printing plates have a layer of a photo-polymer that undergoes a chemical reaction when exposed to actinic radiation. Typically, ultraviolet light is used to expose the photo-polymer in flexographic printing plates. Upon exposure to ultraviolet light the photo-polymer undergoes a cross-linking reaction. The printing plates are exposed through a mask which blocks the actinic radiation from reaching certain portions of the photo-polymer. The mask is patterned with a pattern of opaque and non-opaque areas that form an image to be recreated on the printing plate. After exposure the printing plate can be developed. After development the pattern of exposed and unexposed areas on the printing plate provide a textured surface that may be used to print an image.

Some types of printing plates are used in conjunction with a separate mask. Typically the mask is made from a half-tone film, such as a silver-halide film, which can be placed on top of the plate before the plate is exposed. A problem with this method is that it is necessary to keep the film in accurate alignment and in intimate contact with the plate during exposure. If the mask is misaligned with the printing plate or if the mask is not kept in intimate contact with the printing plate during exposure then the results obtained will be less than optimum. Even when a separate mask is applied carefully to a printing plate the results obtained are often not optimal.

Another method for exposing flexographic plates involves providing a photosensitive plate that has a mask formed integrally with the plate. Such plates include a layer of a photosensitive material, such as a photo-polymer gel, underlying a layer of mask material. Because the mask is integral with the printing plate, this approach provides a mask which is always in intimate contact with the photo-polymer layer and which is always properly aligned with the printing plate. A problem with this method is that the material from which the mask layer is made can diffuse into the photo-polymer gel. Over time, this can degrade the gel. As a result, printing plates that include an integral mask may have undesirably short shelf lives.

The problem of low shelf life is exacerbated because there are a large number of different types of photo-polymers used in printing plates. All have different characteristics and are used in different applications. If each of the different types of printing plates has a short shelf life then it is often not practical for a user to keep on hand a stock of printing plates of any types that will not be quickly used up.

A further problem with printing plates that have integral masking layers is that the masking layer on existing plates is typically fragile. A scratch in any portion of the masking layer can make the entire plate unusable.

U.S. Pat. No. 5,262,275 issued to Fan discloses a flexographic printing element that incorporates a barrier layer that separates an infrared-ablatable masking layer and a photo-polymerizable layer. The barrier layer prevents migration of material from the masking layer into the photo-polymerizable layer. While this construction improves the shelf life of a printing plate it does not avoid the requirement to maintain a number of different types of printing plate in stock that have different types of photo-polymer layer. It also does not address the problem that the masking layer of a printing plate may become damaged, thereby making the plate unusable.

U.S. Pat. No. 6,180,325 issued to Gelbart discloses methods for exposing photosensitive printing plates that address some of the limitations of the prior art. The methods involve mounting a printing plate to a holder; applying a patterned coating to an outer surface of the printing plate by moving a coating applicator relative to the holder; and, exposing the printing plate through the patterned coating to actinic radiation without removing the printing plate from the holder. One embodiment of the Gelbart system applies a mask using an inkjet printhead which ejects ink or other opaque material. The properties of the inkjetted mask material are not specified.

There remains a need in industry for a high-speed process of creating a flexographic mask directly on a photo-imageable flexographic plate material.

SUMMARY OF INVENTION

This invention provides methods for exposing photosensitive printing plates that address some of the limitations of the prior art. A method provided by one aspect of the invention comprises mounting a printing plate to a holder; applying a non-permanent patterned coating to an outer surface of the printing plate by moving a coating applicator relative to the holder; and, exposing the printing plate to actinic radiation through the patterned coating without removing the printing plate from the holder. The invention permits performing coating and exposure steps in a single apparatus. This avoids handling-induced damage.

Since the plate does not need to be handled between the application of the mask and the exposure to actinic radiation, the mask material can be selected to have excellent optical opacity. It is not necessary to select a mask material that is also capable of withstanding handling. Masks used in systems where plates must be handled before they are exposed must have acceptable shelf life, scratch-resistance, flexibility (to avoid cracking when a plate is bent around a drum) and more. Selecting a mask material having acceptable handling characteristics could require sacrificing optimal optical opacity. Where the mask is not disturbed between application and exposure as is possible with this invention, its optical transmittance characteristic, one of the essential properties of the mask, can be optimized.

The invention also permits the use of printing plates that are supplied and stored in an uncoated form. Such printing plates tend to have longer shelf lives than printing plates that are pre-coated. Further, uncoated printing plates lack delicate coatings that can be damaged during storage.

In a preferred embodiment of the invention, the holder comprises a rotatable drum and the patterned coating is applied while rotating the drum. The patterned coating is applied by selectively applying a non-permanent opaque inkjet droplet coating to a surface of the printing plate with an ink jet printing head.

In one embodiment of the invention, ink with a non-volatile solvent, such as an oil-based ink, is used to print a non-permanent halftone dot photomask on the UV-photoimageable layer of a flexographic plate by an inkjet technique. The UV-photo-imageable layer is then exposed with UV radiation through the non-permanent halftone dot photomask. The non-permanent halftone dot photomask does not permanently cure throughout the process and may be removed after UV exposure of the plate. After deposition, but before UV-illumination of the UV-photo-imageable layer, the photomask may be partially cured to change the Theological properties of the ink of which it is composed.

Some of the advantages of the invention are obtained by performing two or more steps that are conventionally performed in separate apparatus in a single apparatus. Thus, an embodiment of the invention provides a method for exposing a photosensitive printing plate. The method comprises applying a patterned coating to a photosensitive printing plate and exposing the printing plate to actinic radiation with both steps performed in a single apparatus without dismounting the printing plate.

Further aspects of the invention and features of specific embodiments of the invention are described below.

BRIEF DESCRIPTION OF DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
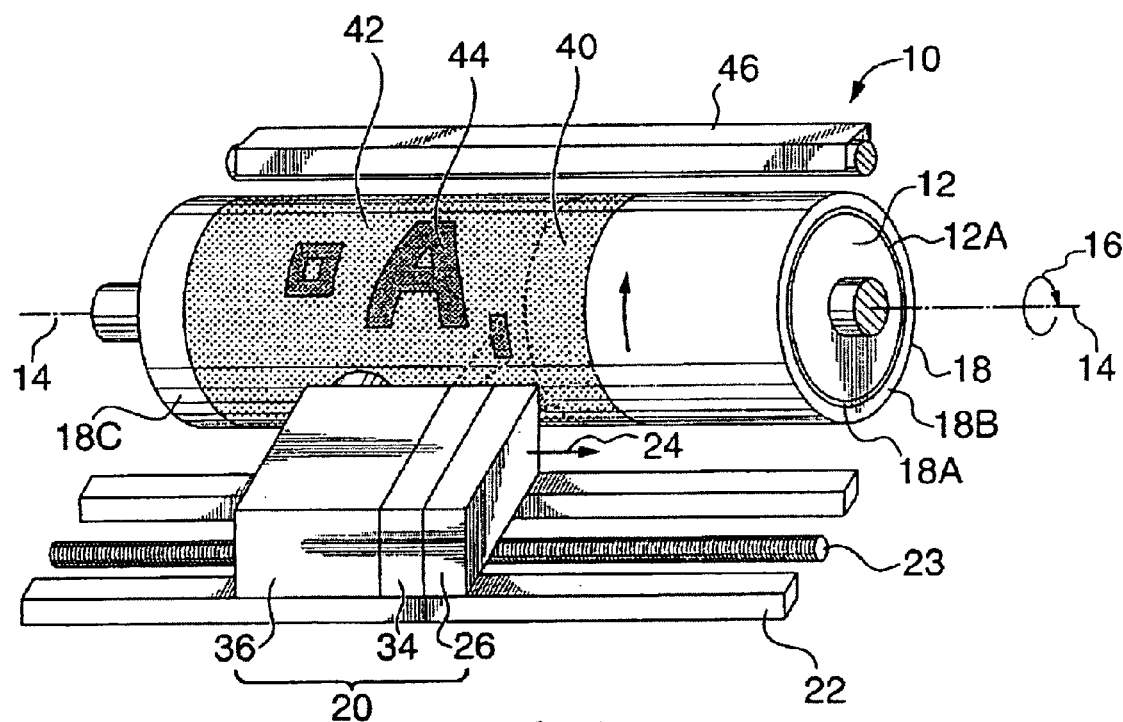
FIG. 1 is a perspective partially schematic view of an apparatus for practicing the invention.

FIG. 1 shows apparatus 10 which may be used to practise the invention. Apparatus 10 includes a drum 12 that is mounted for rotation about an axis 14 as indicated by arrow 16. A photosensitive printing plate 18 is mounted on an outer surface 12A of drum 12. In the illustrated embodiment, printing plate 18 is provided in the form of a seamless sleeve having a substrate, or base layer, 18A that fits snugly onto drum 12 and a photo-polymerizable layer 18B.

Photo-polymerizable layer 18B is initially not covered by any masking layer. If, as is often the case in flexography, plate 18 is not a sleeve that extends around the circumference of drum 12 then plate 18 is held onto drum 12 using any suitable means. Suitable means may include vacuum and/or mechanical clamps (not shown). The term "printing plate" is used herein to describe any form of printing medium before it is imaged. This specifically includes gravure media and flexographic media, including seamless sleeve flexographic media, without being limited to this particular kind of media. The term "holder" is used herein to describe a member on which a printing plate is mounted. The term "holder" includes, but is not limited to, rotatable drums as in the first described embodiment, platens movable in at least one dimension, and fixed flat beds.

A head 20 comprising an inkjet printhead 26 is mounted so that it can be moved parallel to axis 14. In the illustrated embodiment, head 20 is slidably mounted on tracks 22. A screw 23 drives linear motion of head 20 parallel to axis 14 as indicated by arrow 24. An example of an appropriate inkjet head for application in the present invention is a piezoelectric inkjet head with a total number of 510 nozzles and a linear density of 180 nozzles per inch, developed by Seiko Instruments Inc. and supplied by SII Printek Inc. ("SII Printek") of Japan. The term "coating applicator" is used herein to describe a unit that may be used to coat substantially liquid media onto a surface, an inkjet printhead being just one example of a coating applicator.

As drum 12 revolves, inkjet printhead 26 traverses across exposed face 18C of printing plate 18 and, as it does so, imagewise applies inkjet droplet pattern 40 on surface 18C. Preferably, the ink employed for depositing inkjet droplet pattern 40 is a high-opacity ink, based on a substantially non-volatile solvent. More preferably an oil-based ink is used. Many other formulations of inkjet ink are available. Preferable characteristics for other suitable inks include inks that can be partially cured to ensure they do not run after they have been deposited on surface 18C and inks that adhere in liquid state but have poor adhesion in their cured (solid) state.

In order to ensure that the adherence of inkjet droplet pattern 40 to surface 18C is suitably limited, the ink may be chosen to be substantially hydrophobic. By way of example, Jolt brands ink, supplied by Dataproducts Corporation of California, may be employed for this purpose. Alternatively a wax-based ink may be employed.

Figure 2:
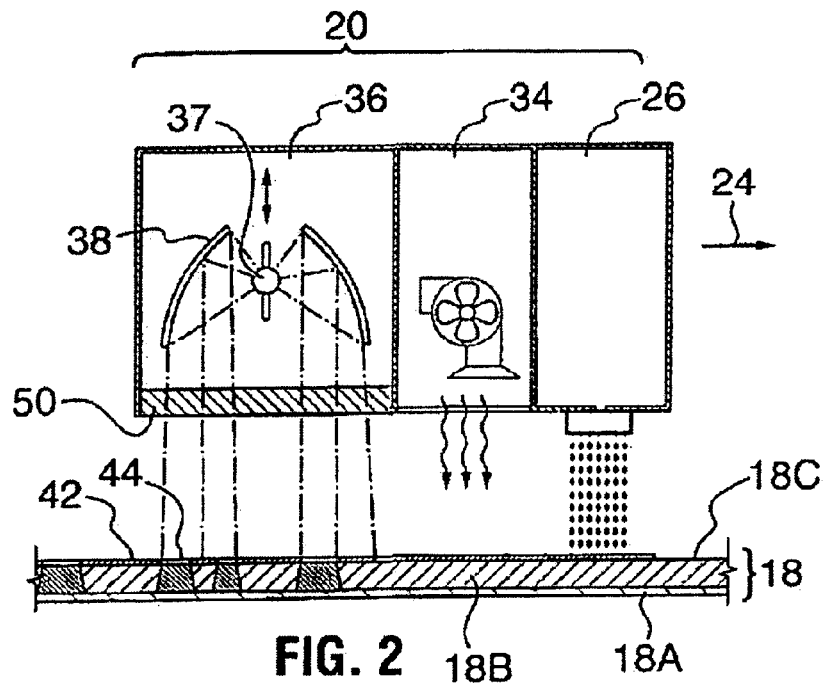
FIG. 2 is a top plan view of a traveling head portion of the apparatus of FIG. 1; and, FIG. 3 is a section through an exposed printing plate according to the invention illustrating the effect of varying the degree of collimation of light used in exposing the printing plate.

Referring now to FIGS. 1 and 2, inkjet printhead 26 produces an inkjet droplet pattern 40 in the form of a pattern of first areas 42 that are opaque to actinic radiation and second areas 44 that are non-opaque to actinic radiation. Inkjet printhead 26 receives a digital control signal from a control unit (not shown) that specifies the locations of areas 42 and 44 which are characterized by the presence or absence, respectively, of ink-jetted ink. Inkjet technology is widely understood and will therefore not be described here.

A curing unit 34 may optionally be provided on head 20 to partially cure inkjet droplet pattern 40 after it is applied. This allows the Theological properties of inkjet droplet pattern 40 to be adjusted such that it is stable enough to survive the rotational forces (which may be exerted as a result of the rotation of drum 12 during the creation of pattern 40 and the exposure of photo-sensitive layer 18B) and yet be easily removable subsequent to UV illumination of photo-sensitive layer 18B. Curing unit 34 may, for example, comprise a nozzle connected to a source of compressed air, another compressed gas or to a fan with some directional elements to channel the flow of gas. The gas in this example may be air or another gas and may be heated such that curing unit 34 further comprises a heater. The term "curing" is used herein to describe any process by which the rheological properties of the ink droplets are changed after deposition. This includes, but is not limited to, cross-linking and drying.

Preferably photo-sensitive layer 18B is exposed to actinic radiation (typically ultraviolet) through the mask formed by inkjet droplet pattern 40 before plate 18 is removed from drum 12. This avoids the possibility of any damage to inkjet droplet pattern 40 that may be caused by handling as plate 18 is removed from drum 12, as it would be in typical industrial flexographic processing.

Exposure of photo-sensitive layer 18B is preferably provided by a suitable light source 36, such as an ultra-violet lamp. Light source 36 is preferably mounted to head 20. The working of light source 36 is described in more detail below.

After plate 18 has been exposed to actinic radiation, inkjet droplet pattern 40 is no longer required. After this point, the condition of inkjet droplet pattern 40 is irrelevant. Inkjet droplet pattern 40 may be removed at this stage. In one embodiment of the invention, the ink is chosen to be based on a low-volatility solvent, such as oil. In this embodiment, the inkjet-deposited photomask layer formed by inkjet droplet pattern 40 may stay liquid throughout the entire process, and is thus easily removable. In another embodiment the rheological properties of the ink are adjusted using curing unit 34 such that inkjet droplet pattern 40 may be easily removed.

The term "non-permanent photomask" is used herein to describe a photomask that is deposited onto the surface of a printing plate, adheres to the surface of the printing plate while the printing plate is illuminated through it and the printing plate is moved, and which may be removed by simple cleaning action such as the cleaning action provided by a blanket cleaner or a liquid under pressure such as a water jet. Where an inkjet pattern is used to form the non-permanent photomask, the ink may be selected to have the optimal properties to exhibit the above behavior. The term "non-adherent inkjet dot pattern" is used herein to describe an inkjet dot pattern that exhibits the above behavior and which may be either liquid or solid, some solid ink compositions being such as to exhibit the same non-permanent adhesion behavior when solidified. Clearly, using curing unit 34, these properties may be suitably adjusted. There exists a wide variety of liquid inks of appropriate composition to exhibit the required property, or which may have the properties adjusted over an adequate range to exhibit the required property by curing unit 34.

A cleaning unit known in the printing industry as a "blanket cleaner" 46 may be employed to remove inkjet droplet pattern 40 from plate 18 after exposure. Suitable blanket cleaners are well known in the industry. One type of blanket cleaner which may be used to clean plate 18 is the IMPACT™ automatic blanket cleaning system available from Baldwin Technology Company, Inc. of Norwalk Conn. As an alternative to a blanket cleaner a high-pressure water jet (not shown) may be used to remove inkjet droplet pattern 40. The use of water jets for cleaning is well known and has the additional advantage that a water jet spray head can follow light source 36 and remove, in the same pass as the exposure, all of inkjet droplet pattern 40 from plate 18 and drum 12. The water jet spray head may be mounted to head 20.

Figure 3A:
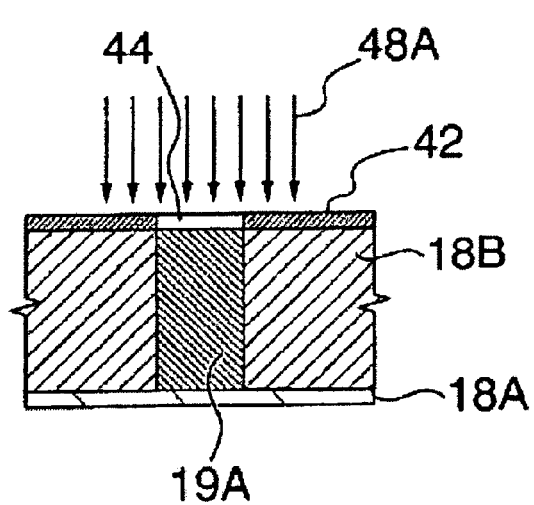
Figure 3B:
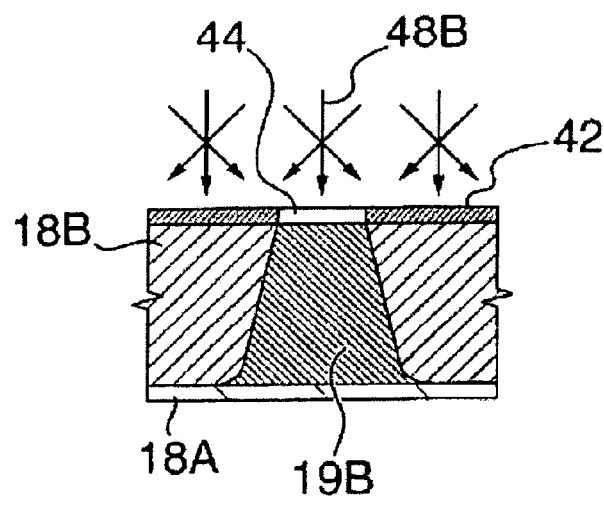

It is preferable to provide a light source 36 that has variable collimation. FIGS. 3*a* and 3*b* are cross-sectional views through sections of a printing plate 18 coated with an opaque ink to form inkjet droplet pattern 40 of FIG. 1 in the form of areas 42 which are opaque to actinic radiation and second areas 44 which are non-opaque to actinic radiation. In FIG. 3*a*, exposure of photo-polymer layer 18 is made with highly collimated light 48A. It can be seen that the light enters photo-polymer layer 18B through an area 44 in masking layer 40 of FIG. 1 and causes polymerization of a region 19A within polymer layer 18B. Because light 48A is highly collimated, the light tends not to spread out as it passes through photo-polymer layer 18B. The result is a feature in photo-polymer layer 18B that has relatively steep sides. FIG. 3*b* shows a situation in which light source 36 is adjusted so that the light 48B incident on mask layer 40 of FIG. 1 is not highly collimated. Because light 48B is not highly collimated, it tends to spread out in photo-polymer layer 18B after passing through transparent areas 44. The result is that photo-polymer layer 18B is polymerized in a region 19B which has sides which slope more gradually than the sides of region 19A.

Typically it is desirable to set the collimation of light source 36 such that the features produced in photo-polymer layer 18B have a desirable profile. In general, the degree of collimation that is desired will depend upon the thickness of photo-polymer layer 18B. A printer skilled in the art will optimize the degree of collimation given that optimizing dot structure is a balance between obtaining run length and highlight retention. A suitable collimation of light would provide the steepest dot shoulders possible with any adjustments away from this making the shoulders broader and the relief dot sturdier. Suitable collimation settings can be determined by exposing a number of samples with different collimation settings and selecting the settings yielding the printer's desired dot shoulder.

As shown in FIG. 2, where light source 36 comprises a lamp 37 and a reflector 38, the collimation may be adjusted by changing the relative positions of lamp 37 and reflector 38. Light source 36 preferably employs a metal halide or mercury arc lamp as lamp 37. Light source 36 may, for example, comprise an ELC4000 400 watt modular light curing system available from the Electro-lite Corporation of Danbury, Conn. Light source 36 could comprise multiple ultraviolet lamps to increase the ultraviolet exposure, if necessary.

Preferably light source 36 includes a filter 50 that prevents undue heating of plate 18 or inkjet droplet pattern 40 such that a filter may be provided in front of light source 36. For example, filter 50 may comprise a dichroic filter that passes only UV radiation. Suitable shields (not shown) may be provided to prevent exposure of uncoated parts of photo-polymer layer 18B by light source 36.

Suitable shields may include a simple baffle such as a plate coated with absorptive material extending toward drum 12 from a point between the inkjet head and light source 36. For embodiments of this invention utilizing a sleeve, where there are no clamps involved, the baffle could be as close to surface 18C as permitted by the tolerances of the media and imaging system (typically a 1–2 mm minimum). The baffle plate may be curved to approximately the same radius as the drum and extend far enough above and below light source 36 to form an effective shield. An alternative embodiment of a shield is to provide a tube around the actinic radiation from light source 36, again in close proximity to surface 18C and curved to approximately the radius of drum 12. The tube walls may be absorbent or may have a series of spaced apart circular apertures of suitable diameter for transmitting actinic radiation from light source 36 and absorbing any scattered light. Such a shield may aid in the collimation of light source 36.

In typical applications of the invention, the rate at which inkjet droplet pattern 40 can be patterned on surface 18C limits the rate at which the method of the invention may be practised. With currently available technology it is generally possible to expose photo-polymer 18B quickly enough to keep up with the rate at which inkjet droplet pattern 40 is patterned by inkjet printhead 26. Additional inkjet printheads may be added to increase the rate of inkjet droplet deposition.

Applying inkjet droplet pattern 40 optionally includes its partial curing by curing unit 34 by, for example, drying with a stream of fan forced or compressed air or another gas.

After the patterned coating has been applied to the printing plate then the printing plate is exposed to actinic radiation from light source 36 through the mask formed by inkjet droplet pattern 40. In a preferred embodiment of the invention this is carried out without dismounting the plate from the drum. Preferably applying the patterned coating and exposing the printing plate are carried out simultaneously on different parts of the printing plate.

After head 20 has completely traversed plate 18 so that every portion of 18 has been coated with inkjet droplet pattern 40 and photo-sensitive layer 18B has been exposed to actinic radiation, then plate 18 may be processed by washing off inkjet droplet pattern 40 together with any uncured parts of photo-polymer layer 18B. Any further processing of plate 18 and subsequent steps in the use of plate 18 for printing may be done by any suitable printing technology including conventional means which are understood in the art.

Use of the invention avoids many disadvantages of printing plates having integral mask layers and also avoids the problems inherent in providing and aligning a separate mask layer.

EXAMPLE

In an example drum based apparatus, inkjet ink is plumbed to a SII Printek 510 nozzle 180 dpi shear mode piezo inkjet head. The ink used for this example is inkjet oil-based pigment black ink provided by Toyo Ink (Japan), and qualified by SII Printek (Japan) for use with their printheads. This specific ink is a fully-saturated oil based ink that never permanently cures.

The voltage waveform delivered to the SII Printek head can be modified to optimally perform with the choice of ink in order to deliver ink jet droplets of the appropriate drop volume. A PLS Cyrel flexographic plate (available from Dupont, USA) is held onto the drum by leading and trailing edge clamps that prevent the plate from moving as the drum spins.

The inkjet printhead is positioned such that the full 71.8 mm nozzle array is in line with the axis of rotation of the drum; thus, the rotation of the drum moves the flexographic plate normal to the nozzle array direction of the inkjet printhead. As the drum rotates the printhead deposits ink on the plate such that the image mask is created. The printhead traverses along the drum (axially) such that the entire flexographic plate may be imaged. Multiple printing passes of the print head over the plate are performed in order to address a variety of undesirable printing artifacts inherent in inkjet printing that may be traced to nozzle performance and in order to build up the required opacity of the mask to the subsequent exposure to UV light.

The opaque areas 42 should have an opacity sufficient to transmit no more than 15% of any incident actinic radiation after the mask is completed. Preferably more than 90%, more preferably more than 95%, and most preferably more than 99.9% of the actinic radiation is blocked by the mask. This opacity can be achieved by further deposition of ink or the selection of an ink with high inherent opacity.

Once the image is complete, a drum-wide UV light with peak intensity at 365 nm capable of delivering 20 mW/cm$^2$ of power to the plate is illuminated in order to expose those areas of the plate not covered by the oil ink mask. The drum is rotated to provide the appropriate exposure to all areas of the plate for the required amount of time. Typically the PLS Cyrel flexographic plate requires approximately 20 minutes of exposure at 20 mW/cm$^2$. After exposure, the UV light is turned off. As the oil-based ink is fully saturated, it is still in liquid form and is removed by a cleaning process either while in the device or once the plate is ejected. The flexographic plate now contains the appropriate image.

As will be apparent to those skilled in the art in the light of the foregoing disclosure, many alterations and modifications are possible in the practice of this invention without departing from the spirit or scope thereof. For example:

The invention, as described above, provides that light source 36 is mounted to and travels as part of the same head 20 that includes inkjet printhead 26. It would be possible to practice the invention by mounting the various individual components of head 20, which are described above, on two or more separate actuators so that each component could be moved across surface 18C of plate 18 in a coordinated fashion.

It would be possible to provide one or more of the components dimensioned to treat the entire plate without moving the component(s). For example, while light source 36 has been described as being moved together with head 20, light source 36 could be a stationary light source. If so, then inkjet droplet pattern 40 could be applied to the entire surface 18C and light source 36 could be used subsequently to expose printing plate 18.

While it is preferable to apply a patterned coating to printing plate 18 and to expose printing plate 18 without dismounting printing plate 18, some benefits of the invention could be achieved by applying inkjet droplet pattern 40 onto plate 18 and then dismounting printing plate 18 and exposing it to actinic radiation in a separate device.

While the above description achieves relative motion between printing plate 18 and head 20 by mounting plate 18 on a rotating drum 12, relative motion between head 20 and plate 18 could also be achieved by scanning head 20 in a two dimensional pattern over plate 18 as in a platen system.

The important features of the invention have been outlined in order that it may be better understood, and in order that the present contribution to the art may be better appreciated. Those skilled in the art will appreciate that the conception on which this disclosure is based may readily be utilized as a basis for the design of other methods and apparatus for carrying out the several purposes of the invention. It is most important, therefore, that this disclosure be regarded as including such equivalent methods and apparatus as do not depart from the spirit and scope of the invention. Accordingly, the scope of the invention is to be construed in accordance with the substance defined by the following claims.

What is claimed is:

1. A method for exposing a photosensitive printing plate, the method comprising:
   mounting the printing plate to a holder;
   imagewise applying a non-permanent photomask to a surface of the printing plate using a coating applicator;
   establishing relative motion between the holder and the coating applicator; and,
   exposing the printing plate to actinic radiation through the non-permanent photomask without removing the printing plate from the holder wherein applying the non-permanent photomask comprises applying a hydrophobic ink to the printing plate.

2. A method as in claim 1, wherein applying the non-permanent photomask comprises ejecting an inkjet droplet pattern from an inkjet printhead.

3. A method as in claim 2, wherein the imagewise applying comprises applying an ink comprising a substantially non-volatile solvent.

4. A method as in claim 3, wherein the substantially non-volatile solvent comprises a wax.

5. A method as in claim 3, wherein the substantially non-volatile solvent comprises an oil.

6. A method as in claim 3, wherein the imagewise applying comprises at least partially curing the non-permanent photomask on the surface of the printing plate before exposing the printing plate to the actinic radiation.

7. A method as in claim 6, wherein the non-permanent photomask remains liquid during exposing the printing plate.

8. A method for exposing a photosensitive printing plate, the method comprising:

mounting the printing plate to a holder;

imagewise applying a non-permanent photomask to a surface of the printing plate using a coating applicator;

establishing relative motion between the holder and the coating applicator; and, exposing the printing plate to actinic radiation through the non-permanent photomask without removing the printing plate from the holder wherein the non-permanent photomask remains liquid during exposing the printing plate and the method comprises removing the non-permanent photomask without de-mounting the printing plate from the holder wherein the removing comprises using one of a blanket cleaner and a water jet.

9. A method for exposing a photosensitive printing plate, the method comprising:

mounting the printing plate to a holder;

imagewise applying a non-permanent photomask to a surface of the printing plate using a coating applicator;

establishing relative motion between the holder and the coating applicator; and, exposing the printing plate to actinic radiation through the non-permanent photomask without removing the printing plate from the holder wherein the non-permanent photomask remains liquid during exposing the printing plate and the method comprises removing the non-permanent photomask without de-mounting the printing plate from the holder wherein the removing comprises applying printing ink to the printing plate.

10. A method for exposing a photosensitive printing plate, the method comprising:

mounting the printing plate to a holder;

imagewise applying a non-permanent photomask to a surface of the printing plate using a coating applicator;

establishing relative motion between the holder and the coating applicator; and, exposing the printing plate to actinic radiation through the non-permanent photomask without removing the printing plate from the holder;

wherein the non-permanent photomask remains liquid during exposing the printing plate and, the non-permanent photomask comprises a hydrophobic liquid.

11. A method as in claim 10, wherein the hydrophobic liquid comprises a hydrophobic liquid ink.

12. A method as in claim 11, wherein the non-permanent photomask comprises a non-adherent inkjet dot pattern.

13. A method as in claim 11, comprising providing a baffle coated with an adsorptive material to shield the printing plate from scattered light during the exposing.

14. A method for exposing a photosensitive printing plate, the method comprising:

mounting the printing plate to a holder;

imagewise applying a non-permanent photomask to a surface of the printing plate using a coating applicator;

establishing relative motion between the holder and the coating applicator; and, exposing the printing plate to actinic radiation through the non-permanent photomask without removing the printing plate from the holder:

wherein the non-permanent photomask remains liquid during exposing the printing plate, the non-permanent photomask comprises a hydrophobic liquid, and the hydrophobic liquid comprises a hydrophobic liquid ink, the method comprising removing the non-permanent photomask after the exposing wherein the liquid ink remains liquid during the removing of the photomask.

15. A method as in claim 14, comprising:

performing the imagewise applying while moving the coating applicator relative to the holder; wherein the non-permanent photomask comprises a non-adherent inkjet dot pattern and the coating applicator comprises an inkjet printhead; and, subsequently removing the non-permanent photomask from the surface without de-mounting the printing plate from the holder.

16. A method as in claim 14, comprising:

at least partly curing the non-permanent photomask before the exposing of the printing plate; and, removing the non-permanent photomask from the surface without de-mounting the printing plate from the holder.

17. A method as in claim 16, wherein:

removing the non-permanent photomask from the surface comprises using at least one of a blanket cleaner, a water jet and the process of applying printing ink to the printing plate.

* * * * *